United States Patent
Silverbrook

(10) Patent No.: US 7,576,795 B2
(45) Date of Patent: *Aug. 18, 2009

(54) DIGITAL IMAGE CAMERA USING AUTOFOCUS INFORMATION FOR IMAGE ENHANCEMENT

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 709 days.

This patent is subject to a terminal disclaimer.

(21) Appl. No.: 10/831,238

(22) Filed: Apr. 26, 2004

(65) Prior Publication Data

US 2004/0196382 A1 Oct. 7, 2004

Related U.S. Application Data

(63) Continuation of application No. 09/112,750, filed on Jul. 10, 1998, now Pat. No. 6,727,948.

(30) Foreign Application Priority Data

Jul. 15, 1997 (AU) .................................. PO7991
Jul. 15, 1997 (AU) .................................. PO8025

(51) Int. Cl.
   *H04N 5/232* (2006.01)
   *H04N 5/76* (2006.01)
(52) U.S. Cl. .................... 348/345; 348/347; 348/231.6
(58) Field of Classification Search ................ 348/347, 348/355
   See application file for complete search history.

(56) References Cited

U.S. PATENT DOCUMENTS

| 4,762,986 | A |  | 8/1988 | Suda et al. |
| 4,868,676 | A |  | 9/1989 | Matsuura et al. |
| 4,914,452 | A |  | 4/1990 | Fukawa |
| 4,937,676 | A |  | 6/1990 | Finelli et al. |
| 5,031,049 | A |  | 7/1991 | Toyama et al. |
| 5,235,428 | A |  | 8/1993 | Hirota et al. |
| 5,398,131 | A |  | 3/1995 | Hall et al. |
| 5,434,621 | A |  | 7/1995 | Yu |
| 5,463,470 | A | * | 10/1995 | Terashita et al. ............ 382/162 |
| 5,502,485 | A |  | 3/1996 | Suzuki |
| 5,512,951 | A |  | 4/1996 | Torri |
| 5,745,175 | A |  | 4/1998 | Anderson |
| 5,757,388 | A |  | 5/1998 | Stephenson |
| 5,835,136 | A |  | 11/1998 | Watanabe et al. |
| 6,011,585 | A | * | 1/2000 | Anderson .................... 348/272 |
| 6,157,394 | A |  | 12/2000 | Anderson et al. |
| 6,163,340 | A | * | 12/2000 | Yasuda ....................... 348/345 |
| 6,727,948 | B1 | * | 4/2004 | Silverbrook ................ 348/345 |
| 7,250,975 | B2 | * | 7/2007 | Silverbrook ................ 348/345 |
| 7,385,639 | B2 | * | 6/2008 | Silverbrook ................ 348/345 |

FOREIGN PATENT DOCUMENTS

| EP | 0382044 A2 | 8/1990 |
| EP | 0398295 A2 | 11/1990 |

(Continued)

*Primary Examiner*—David L Ometz
*Assistant Examiner*—Luong T Nguyen

(57) ABSTRACT

A method of processing a digital image comprising: capturing the image utilizing an adjustable focusing technique; utilizing the focusing settings as an indicator of the position of structures within the image; and processing the image, utilizing the said focus settings to produce effects specific to said focus settings.

4 Claims, 2 Drawing Sheets

FOREIGN PATENT DOCUMENTS

| | | |
|---|---|---|
| EP | 0763930 A1 | 3/1997 |
| JP | 06-149051 | 5/1994 |
| JP | 09-071015 | 3/1997 |
| JP | 09-116843 | 5/1997 |
| JP | 09-187040 | 7/1997 |
| WO | WO 95/16323 | 6/1995 |
| WO | WO 96/32265 A | 10/1996 |
| WO | WO 97/06958 A | 2/1997 |

* cited by examiner

DIGITAL IMAGE CAMERA USING AUTOFOCUS INFORMATION FOR IMAGE ENHANCEMENT

CROSS-REFERENCE TO RELATED APPLICATION

This Application is a Continuation of U.S. Ser. No. 09/112,750, filed on Jul. 10, 1998, now Issued U.S. Pat. No. 6,727,948.

FIELD OF THE INVENTION

The present invention relates to an image processing method and apparatus and, in particular, discloses a process for utilising autofocus information in a digital image camera.

BACKGROUND OF THE INVENTION

Recently, digital cameras have become increasingly popular. These cameras normally operate by means of imaging a desired image utilizing a charge coupled device (CCD) array and storing the imaged scene on an electronic storage medium for later down loading onto a computer system for subsequent manipulation and printing out. Normally, when utilizing a computer system to print out an image, sophisticated software may be available to manipulate the image in accordance with requirements.

Unfortunately such systems require significant post processing of a captured image and normally present the image in an orientation in which is was taken, relying on the post processing process to perform any necessary or required modifications of the captured image.

SUMMARY OF THE INVENTION

It is an object of the present invention to provide a method for enhanced processing of images captured by a digital camera utilising autofocus settings.

In accordance with a first aspect of the present invention there is provided a method of generating a manipulated output image by means of a digital camera, the method comprising the steps of:

capturing a focused image using an automatic focusing technique generating focus settings;

generating a manipulated output image by applying a digital image manipulating process to the focused image, the digital image manipulating process utilizing the focus settings.

Preferably the focus settings include a current position of a zoom motor of the digital camera.

In a preferred embodiment the digital image manipulating process includes a step of locating an object within the focused image utilizing the focus settings.

The method may include the step of printing out the manipulated image by means of a printing mechanism incorporated into the digital camera.

It is preferred that the digital image manipulating process selectively applies techniques to the focused image on the basis of the focus settings.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED EMBODIMENTS

Figure 2:
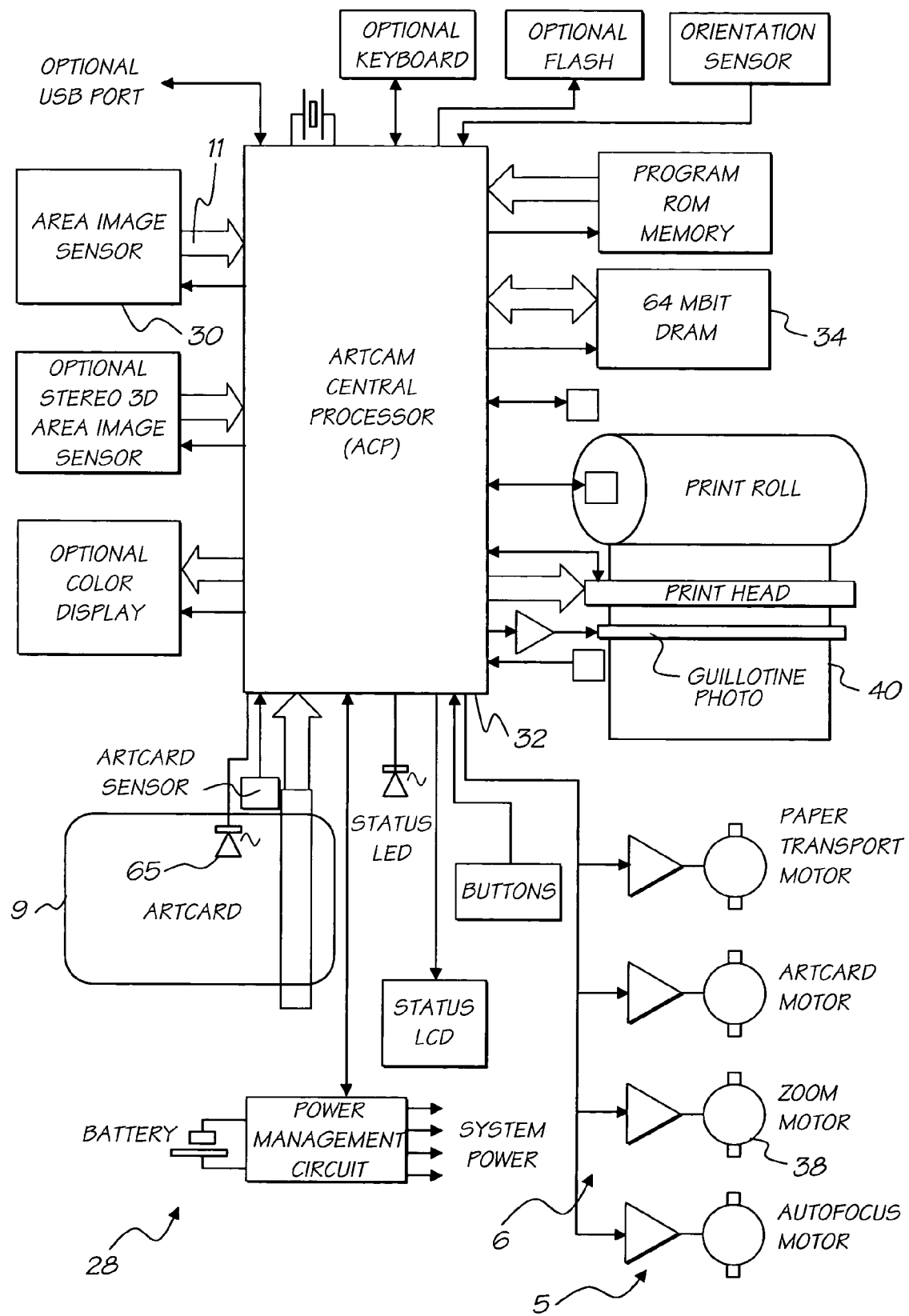
FIG. 2 illustrates a block diagram of the ARTCAM type camera.

The preferred embodiment is preferably implemented through suitable programming of a hand held camera device such as that described in the concurrently filed application, Applicant's reference ART01, U.S. Ser. No. 09/113,060 entitled "A Digital Camera with Image Processing Capability" filed concurrently herewith by the present applicant the content of which is hereby specifically incorporated by cross reference and the details of which, and other related applications are set out in the tables below. FIG. 2 shows a block diagram thereof.

The aforementioned patent specification discloses a camera system, hereinafter known as an "Artcam" type camera, wherein sensed images can be directly printed out by an Artcam portable camera unit such as illustrated in FIG. 2. Further, the aforementioned specification discloses means and methods for performing various manipulations on images captured by the camera sensing device 30 leading to the production of various effects in any output image 40. The manipulations are disclosed to be highly flexible in nature and can be implemented through the insertion into the Artcam of cards having encoded thereon various instructions for the manipulation of images, the cards 9 hereinafter being known as Artcards. The Artcam further has significant onboard processing power by an Artcam Central Processor unit (ACP) 32 which is interconnected to a memory device 34 for the storage of important data and images.

In the preferred embodiment, autofocus is achieved by processing of a CCD data stream to ensure maximum contrast. Techniques for determining a focus position based on a CCD data stream are known. For example, reference is made to "The Encyclopedia of Photography" editors Leslie Stroebel and Richard Zakia, published 1993 by Butterworth-Heinemann and "Applied Photographic Optics" by London & Boston, Focal Press, 1988. These techniques primarily rely on measurements of contrast between adjacent pixels over portions of an input image. The image is initially processed by the ACP in order to determine a correct autofocus setting.

This autofocus information is then utilized by the ACP 32 in certain modes, for example, when attempting to locate faces within the image, as a guide to the likely size of any face within the image, thereby simplifying the face location process.

Figure 1:
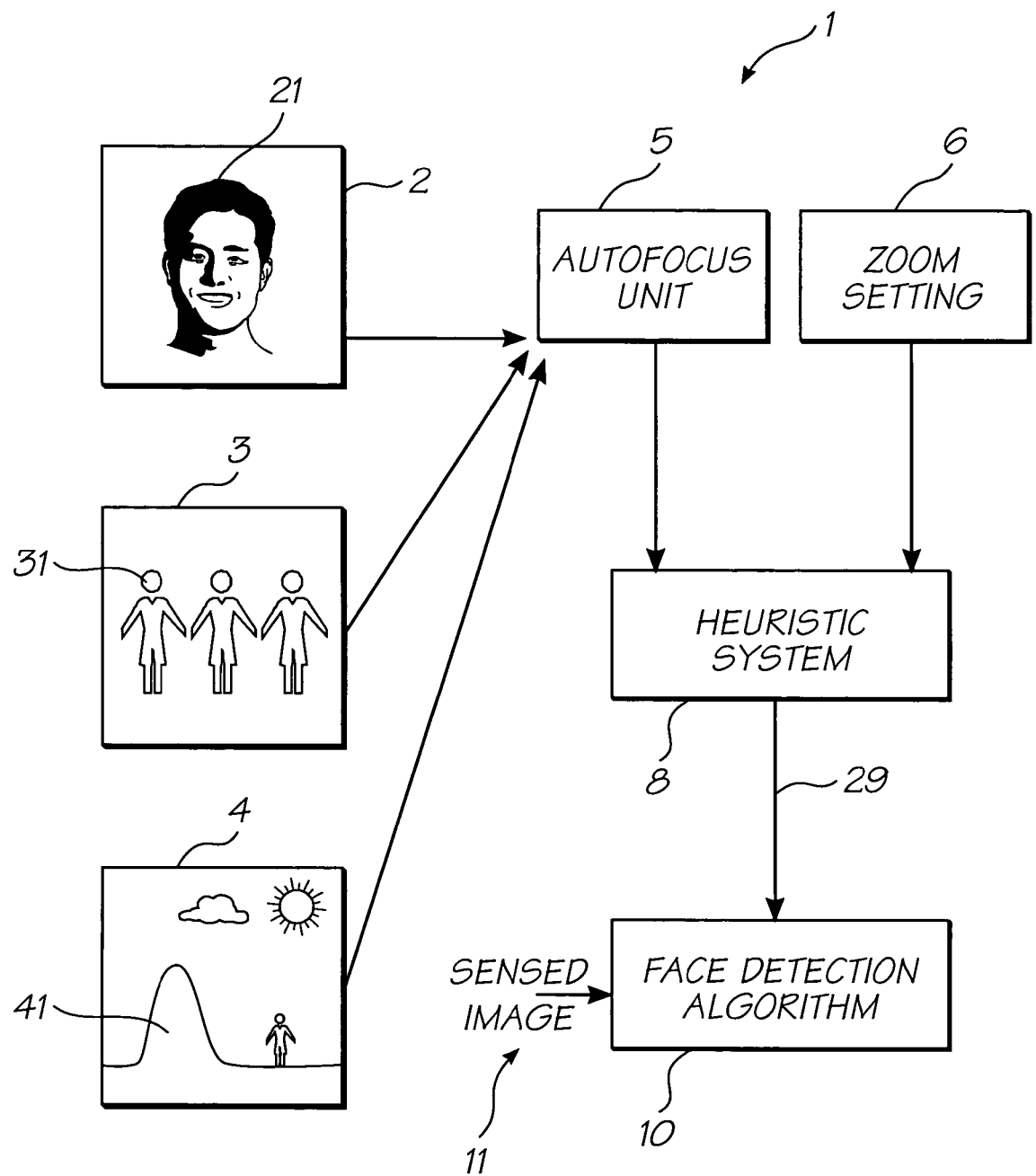
FIG. 1 illustrates the method of the preferred embodiment.

Turning now to FIG. 1, there is illustrated an example of the method utilized to determine likely image characteristics for examination by a face detection algorithm 10.

Various images eg. 2, 3 and 4 are imaged by the camera device 28. As a by product of the operation of the autofocusing the details of the focusing settings of the autofocus unit 5 are stored by the ACP 32. Additionally, a current position of the zoom motor 38 is also utilized as zoom setting 6. Both of these settings are determined by the ACP 32. Subsequently, the ACP 32 applies analysis techniques in heuristic system 8 to the detected values before producing an output 29 having a magnitude corresponding to the likely depth location of objects of interest 21, 31 or 41 within the image 2, 3 or 4 respectively.

Next, the depth value is utilised in a face detection algorithm 10 running on the ACP 32 in addition to the inputted sensed image 11 so as to locate objects within the image. A close output 29 corresponding to a range value indicates a high probability of a portrait image, a medium range indicates a high probability of a group photograph and a further range indicates a higher probability of a landscape image. This probability information can be utilized as an aid for the face detection algorithm and also can be utilised for selecting between various parameters when producing "painting" effects within the image or painting the image with clip arts or the like, with different techniques or clip arts being applied depending on the distance to an object.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

The present invention is further best utilized in the Artcam device, the details of which are set out in the following paragraphs although it is not restricted thereto.

Ink Jet Technologies

The embodiments of the invention use an ink jet printer type device. Of course many different devices could be used. However presently popular ink jet printing technologies are unlikely to be suitable.

The most significant problem with thermal inkjet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal inkjet applications. This leads to an efficiency of around 0.02%, from electricity input to drop momentum (and increased surface area) out.

The most significant problem with piezoelectric inkjet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of page width print heads with 19,200 nozzles.

Ideally, the inkjet technologies used meet the stringent requirements of in-camera digital color printing and other high quality, high speed, low cost printing applications. To meet the requirements of digital photography, new inkjet technologies have been created. The target features include:
  low power (less than 10 Watts)
  high resolution capability (1,600 dpi or more)
  photographic quality output
  low manufacturing cost
  small size (page width times minimum cross section)
  high speed (<2 seconds per page).

All of these features can be met or exceeded by the inkjet systems described below with differing levels of difficulty. Forty five different inkjet technologies have been developed by the Assignee to give a wide range of choices for high volume manufacture. These technologies form part of separate applications assigned to the present Assignee as set out in the table below.

The inkjet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the inkjet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Cross-Referenced Applications

The following table is a guide to cross-referenced patent applications filed concurrently herewith and discussed hereinafter with the reference being utilized in subsequent tables when referring to a particular case:

| Docket | Reference | Title |
|---|---|---|
| IJ01US | 6,227,652 | Radiant Plunger Ink Jet Printer |
| IJ02US | 6,213,588 | Electrostatic Ink Jet Printer |
| IJ03US | 6,213,589 | Planar Thermoelastic Bend Actuator Ink Jet |
| IJ04US | 6,231,163 | Stacked Electrostatic Ink Jet Printer |
| IJ05US | 6,247,795 | Reverse Spring Lever Ink Jet Printer |
| IJ06US | 6,394,581 | Paddle Type Ink Jet Printer |
| IJ07US | 6,244,691 | Permanent Magnet Electromagnetic Ink Jet Printer |
| IJ08US | 6,257,704 | Planar Swing Grill Electromagnetic Ink Jet Printer |
| IJ09US | 6,416,168 | Pump Action Refill Ink Jet Printer |
| IJ10US | 6,220,694 | Pulsed Magnetic Field Ink Jet Printer |
| IJ11US | 6,257,705 | Two Plate Reverse Firing Electromagnetic Ink Jet Printer |
| IJ12US | 6,247,794 | Linear Stepper Actuator Ink Jet Printer |
| IJ13US | 6,234,610 | Gear Driven Shutter Ink Jet Printer |
| IJ14US | 6,247,793 | Tapered Magnetic Pole Electromagnetic Ink Jet Printer |
| IJ15US | 6,264,306 | Linear Spring Electromagnetic Grill Ink Jet Printer |
| IJ16US | 6,241,342 | Lorenz Diaphragm Electromagnetic Ink Jet Printer |
| IJ17US | 6,247,792 | PTFE Surface Shooting Shuttered Oscillating Pressure Ink Jet Printer |
| IJ18US | 6,264,307 | Buckle Grip Oscillating Pressure Ink Jet Printer |
| IJ19US | 6,254,220 | Shutter Based Ink Jet Printer |
| IJ20US | 6,234,611 | Curling Calyx Thermoelastic Ink Jet Printer |
| IJ21US | 6,302,528 | Thermal Actuated Ink Jet Printer |
| IJ22US | 6,283,582 | Iris Motion Ink Jet Printer |
| IJ23US | 6,239,821 | Direct Firing Thermal Bend Actuator Ink Jet Printer |
| IJ24US | 6,338,547 | Conductive PTFE Ben Activator Vented Ink Jet Printer |
| IJ25US | 6,247,796 | Magnetostrictive Ink Jet Printer |
| IJ26US | 6,557,977 | Shape Memory Alloy Ink Jet Printer |
| IJ27US | 6,390,603 | Buckle Plate Ink Jet Printer |
| IJ28US | 6,362,843 | Thermal Elastic Rotary Impeller Ink Jet Printer |
| IJ29US | 6,293,653 | Thermoelastic Bend Actuator Ink Jet Printer |
| IJ30US | 6,312,107 | Thermoelastic Bend Actuator Using PTFE and Corrugated Copper Ink Jet Printer |
| IJ31US | 6,227,653 | Bend Actuator Direct Ink Supply Ink Jet Printer |
| IJ32US | 6,234,609 | A High Young's Modulus Thermoelastic Ink Jet Printer |
| IJ33US | 6,238,040 | Thermally actuated slotted chamber wall ink jet printer |
| IJ34US | 6,188,415 | Ink Jet Printer having a thermal actuator comprising an external coiled spring |
| IJ35US | 6,227,654 | Trough Container Ink Jet Printer |
| IJ36US | 6,209,989 | Dual Chamber Single Vertical Actuator Ink Jet |

-continued

| Docket | Reference | Title |
|---|---|---|
| IJ37US | 6,247,791 | Dual Nozzle Single Horizontal Fulcrum Actuator Ink Jet |
| IJ38US | 6,336,710 | Dual Nozzle Single Horizontal Actuator Ink Jet |
| IJ39US | 6,217,153 | A single bend actuator cupped paddle ink jet printing device |
| IJ40US | 6,416,167 | A thermally actuated ink jet printer having a series of thermal actuator units |
| IJ41US | 6,243,113 | A thermally actuated ink jet printer including a tapered heater element |
| IJ42US | 6,283,581 | Radial Back-Curling Thermoelastic Ink Jet |
| IJ43US | 6,247,790 | Inverted Radial Back-Curling Thermoelastic Ink Jet |
| IJ44US | 6,260,953 | Surface bend actuator vented ink supply ink jet printer |
| IJ45US | 6,267,469 | Coil Acutuated Magnetic Plate Ink Jet Printer |

Tables of Drop-on-Demand Inkjets

Eleven important characteristics of the fundamental operation of individual inkjet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of inkjet types.

Actuator mechanism (18 types)
Basic operation mode (7 types)
Auxiliary mechanism (8 types)
Actuator amplification or modification method (17 types)
Actuator motion (19 types)
Nozzle refill method (4 types)
Method of restricting back-flow through inlet (10 types)
Nozzle clearing method (9 types)
Nozzle plate construction (9 types)
Drop ejection direction (5 types)
Ink type (7 types)

The complete eleven dimensional table represented by these axes contains 36.9 billion possible configurations of inkjet nozzle. While not all of the possible combinations result in a viable inkjet technology, many million configurations are viable. It is clearly impractical to elucidate all of the possible configurations. Instead, certain inkjet types have been investigated in detail. These are designated IJ01 to IJ45 above.

Other inkjet configurations can readily be derived from these forty five examples by substituting alternative configurations along one or more of the 11 axes. Most of the IJ01 to IJ45 examples can be made into inkjet print heads with characteristics superior to any currently available inkjet technology.

Where there are prior art examples known to the inventor, one or more of these examples are listed in the examples column of the tables below. The IJ01 to IJ45 series are also listed in the examples column. In some cases, a print technology may be listed more than once in a table, where it shares characteristics with more than one entry.

Suitable applications include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| ACTUATOR MECHANISM (APPLIED ONLY TO SELECTED INK DROPS) | | | | |
|---|---|---|---|---|
| Actuator Mechanism | Description | Advantages | Disadvantages | Examples |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | Large force generated Simple construction No moving parts Fast operation Small chip area required for actuator | High power Ink carrier limited to water Low efficiency High temperatures required High mechanical stress Unusual materials required Large drive transistors Cavitation causes actuator failure Kogation reduces bubble formation Large print heads are difficult to fabricate | Canon Bubblejet 1979 Endo et al GB patent 2,007,162 Xerox heater-in-pit 1990 Hawkins et al U.S. Pat. No. 4,899,181 Hewlett-Packard TIJ 1982 Vaught et al U.S. Pat. No. 4,490,728 |
| Piezoelectric | A piezoelectric crystal such as lead lanthanum zirconate (PZT) is electrically activated, and either expands, shears, or | Low power consumption Many ink types can be used Fast operation High efficiency | Very large area required for actuator Difficult to integrate with electronics | Kyser et al U.S. Pat. No. 3,946,398 Zoltan U.S. Pat. No. 3,683,212 1973 Stemme U.S. Pat. No. 3,747,120 Epson Stylus |

-continued

ACTUATOR MECHANISM (APPLIED ONLY TO SELECTED INK DROPS)

| Actuator Mechanism | Description | Advantages | Disadvantages | Examples |
|---|---|---|---|---|
| | bends to apply pressure to the ink, ejecting drops. | | High voltage drive transistors required<br>Full pagewidth print heads impractical due to actuator size<br>Requires electrical poling in high field strengths during manufacture | Tektronix IJ04 |
| Electro-strictive | An electric field is used to activate electrostriction in relaxor materials such as lead lanthanum zirconate titanate (PLZT) or lead magnesium niobate (PMN). | Low power consumption<br>Many ink types can be used<br>Low thermal expansion<br>Electric field strength required (approx. 3.5 V/μm) can be generated without difficulty<br>Does not require electrical poling | Low maximum strain (approx. 0.01%)<br>Large area required for actuator due to low strain<br>Response speed is marginal (~10 μs)<br>High voltage drive transistors required<br>Full pagewidth print heads impractical due to actuator size | Seiko Epson, Usui et all JP 253401/96 IJ04 |
| Ferroelectric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | Low power consumption<br>Many ink types can be used<br>Fast operation (<1 μs)<br>Relatively high longitudinal strain<br>High efficiency<br>Electric field strength of around 3 V/μm can be readily provided | Difficult to integrate with electronics<br>Unusual materials such as PLZSnT are required<br>Actuators require a large area | IJ04 |
| Electrostatic plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | Low power consumption<br>Many ink types can be used<br>Fast operation | Difficult to operate electrostatic devices in an aqueous environment<br>The electrostatic actuator will normally need to be separated from the ink<br>Very large area required to achieve high forces<br>High voltage drive transistors may be required<br>Full pagewidth print heads are not competitive due to actuator size | IJ02, IJ04 |
| Electrostatic pull on ink | A strong electric field is applied to the ink, whereupon electrostatic attraction accelerates the ink towards the print medium. | Low current consumption<br>Low temperature | High voltage required<br>May be damaged by sparks due to air breakdown<br>Required field strength increases as the drop size decreases<br>High voltage drive transistors required<br>Electrostatic field attracts dust | 1989 Saito et al, U.S. Pat. No. 4,799,068<br>1989 Miura et al, U.S. Pat. No. 4,810,954<br>Tone-jet |
| Permanent magnet electro-magnetic | An electromagnet directly attracts a permanent magnet, displacing ink and causing drop ejection. Rare earth magnets with a field strength around 1 Tesla can be | Low power consumption<br>Many ink types can be used<br>Fast operation<br>High efficiency<br>Easy extension from single nozzles to pagewidth print heads | Complex fabrication<br>Permanent magnetic material such as Neodymium Iron Boron (NdFeB) required.<br>High local currents required<br>Copper metalization | IJ07, IJ10 |

-continued

ACTUATOR MECHANISM (APPLIED ONLY TO SELECTED INK DROPS)

| Actuator Mechanism | Description | Advantages | Disadvantages | Examples |
|---|---|---|---|---|
| | used. Examples are: Samarium Cobalt (SaCo) and magnetic materials in the neodymium iron boron family (NdFeB, NdDyFeBNb, NdDyFeB, etc) | | should be used for long electromigration lifetime and low resistivity Pigmented inks are usually infeasible Operating temperature limited to the Curie temperature (around 540 K) | |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be used for long electromigration lifetime and low resistivity Electroplating is required High saturation flux density is required (2.0-2.1 T is achievable with CoNiFe [1]) | IJ01, IJ05, IJ08, IJ10 IJ12, IJ14, IJ15, IJ17 |
| Magnetic Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | Low power consumption Many ink types can be used Fast operation High efficiency Easy extension from single nozzles to pagewidth print heads | Force acts as a twisting motion Typically, only a quarter of the solenoid length provides force in a useful direction High local currents required Copper metalization should be used for long electromigration lifetime and low resistivity Pigmented inks are usually infeasible | IJ06, IJ11, IJ13, IJ16 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, U.S. Pat. No. 4,032,929 IJ25 |
| Surface tension reduction | Ink under positive pressure is held in a nozzle by surface tension. The surface tension of the ink is reduced below the bubble threshold, causing the ink to egress from the nozzle. | Low power consumption Simple construction No unusual materials required in fabrication High efficiency Easy extension from single nozzles to pagewidth print heads | Requires supplementary force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction | Simple construction No unusual materials required in fabrication Easy extension from single nozzles to pagewidth print | Requires supplementary force to effect drop separation Requires special ink viscosity properties | Silverbrook, EP 0771 658 A2 and related patent applications |

-continued

ACTUATOR MECHANISM (APPLIED ONLY TO SELECTED INK DROPS)

| Actuator Mechanism | Description | Advantages | Disadvantages | Examples |
|---|---|---|---|---|
| | can be achieved electrothermally with most inks, but special inks can be engineered for a 100:1 viscosity reduction. | heads | High speed is difficult to achieve Requires oscillating ink pressure A high temperature difference (typically 80 degrees) is required | |
| Acoustic | An acoustic wave is generated and focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermoelastic bend actuator | An actuator which relies upon differential thermal expansion upon Joule heating is used. | Low power consumption Many ink types can be used Simple planar fabrication Small chip area required for each actuator Fast operation High efficiency CMOS compatible voltages and currents Standard MEMS processes can be used Easy extension from single nozzles to pagewidth print heads | Efficient aqueous operation requires a thermal insulator on the hot side Corrosion prevention can be difficult Pigmented inks may be infeasible, as pigment particles may jam the bend actuator | IJ03, IJ09, IJ17, IJ18 IJ19, IJ20, IJ21, IJ22 IJ23, IJ24, IJ27, IJ28 IJ29, IJ30, IJ31, IJ32 IJ33, IJ34, IJ35, IJ36 IJ37, IJ38, IJ39, IJ40 IJ41 |
| High CTE thermoelastic actuator | A material with a very high coefficient of thermal expansion (CTE) such as polytetrafluoroethylene (PTFE) is used. As high CTE materials are usually non-conductive, a heater fabricated from a conductive material is incorporated. A 50 μm long PTFE bend actuator with polysilicon heater and 15 mW power input can provide 180 μN force and 10 μm deflection. Actuator motions include: 1) Bend 2) Push 3) Buckle 4) Rotate | High force can be generated PTFE is a candidate for low dielectric constant insulation in ULSI Very low power consumption Many ink types can be used Simple planar fabrication Small chip area required for each actuator Fast operation High efficiency CMOS compatible voltages and currents Easy extension from single nozzles to pagewidth print heads | Requires special material (e.g. PTFE) Requires a PTFE deposition process, which is not yet standard in ULSI fabs PTFE deposition cannot be followed with high temperature (above 350 °C.) processing Pigmented inks may be infeasible, as pigment particles may jam the bend actuator | IJ09, IJ17, IJ18, IJ20 IJ21, IJ22, IJ23, IJ24 IJ27, IJ28, IJ29, IJ30 IJ31, IJ42, IJ43, IJ44 |
| Conductive polymer thermoelastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include: 1) Carbon nanotubes 2) Metal fibers 3) Conductive polymers such as doped polythiophene 4) Carbon granules | High force can be generated Very low power consumption Many ink types can be used Simple planar fabrication Small chip area required for each actuator Fast operation High efficiency CMOS compatible voltages and currents Easy extension from single nozzles to pagewidth print heads | Requires special materials development (High CTE conductive polymer) Requires a PTFE deposition process, which is not yet standard in ULSI fabs PTFE deposition cannot be followed with high temperature (above 350 °C.) processing Evaporation and CVD deposition techniques cannot be used Pigmented inks may be infeasible, as pigment particles may jam the bend actuator | IJ24 |

ACTUATOR MECHANISM (APPLIED ONLY TO SELECTED INK DROPS)

| Actuator Mechanism | Description | Advantages | Disadvantages | Examples |
|---|---|---|---|---|
| Shape memory alloy | A shape memory alloy such as TiNi (also known as Nitinol - Nickel Titanium alloy developed at the Naval Ordnance Laboratory) is thermally switched between its weak martensitic state and its high stiffness austenic state. The shape of the actuator in its martensitic state is deformed relative to the austenic shape. The shape change causes ejection of a drop. | High force is available (stresses of hundreds of MPa) Large strain is available (more than 3%) High corrosion resistance Simple construction Easy extension from single nozzles to pagewidth print heads Low voltage operation | Fatigue limits maximum number of cycles Low strain (1%) is required to extend fatigue resistance Cycle rate limited by heat removal Requires unusual materials (TiNi) The latent heat of transformation must be provided High current operation Requires pre-stressing to distort the martensitic state | IJ26 |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | Linear Magnetic actuators can be constructed with high thrust, long travel, and high efficiency using planar semiconductor fabrication techniques Long actuator travel is available Medium force is available Low voltage operation | Requires unusual semi-conductor materials such as soft magnetic alloys (e.g. CoNiFe [1]) Some varieties also require permanent magnetic materials such as Neodymium iron boron (NdFeB) Requires complex multi-phase drive circuitry High current operation | IJ12 |

BASIC OPERATION MODE

| Operational mode | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | Simple operation No external fields required Satellite drops can be avoided if drop velocity is less than 4 m/s Can be efficient, depending upon the actuator used | Drop repetition rate is usually limited to less than 10 KHz. However, this is not fundamental to the method, but is related to the refill method normally used All of the drop kinetic energy must be provided by the actuator Satellite drops usually form if drop velocity is greater than 4.5 m/s | Thermal inkjet Piezoelectric inkjet IJ01, IJ02, IJ03, IJ04 IJ05, IJ06, IJ07, IJ09 IJ11, IJ12, IJ14, IJ16 IJ20, IJ22, IJ23, IJ24 IJ25, IJ26, IJ27, IJ28 IJ29, IJ30, IJ31, IJ32 IJ33, IJ34, IJ35, IJ36 IJ37, IJ38, IJ39, IJ40 IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | Very simple print head fabrication can be used The drop selection means does not need to provide the energy required to separate the drop from the nozzle | Requires close proximity between the print head and the print media or transfer roller May require two print heads printing alternate rows of the image Monolithic color print heads are difficult | Silverbrook, EP 0771 658 A2 and related patent applications |
| Electrostatic pull on ink | The drops to be printed are selected by some manner (e.g. thermally induced surface tension reduction of pressurized ink). Selected | Very simple print head fabrication can be used The drop selection means does not need to provide the energy required to separate the drop from the nozzle | Requires very high electrostatic field Electrostatic field for small nozzle sizes is above air breakdown Electrostatic field may attract dust | Silverbrook, EP 0771 658 A2 and related patent applications Tone-Jet |

-continued

BASIC OPERATION MODE

| Operational mode | Description | Advantages | Disadvantages | Examples |
|---|---|---|---|---|
| | drops are separated from the ink in the nozzle by a strong electric field. | | | |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | Very simple print head fabrication can be used The drop selection means does not need to provide the energy required to separate the drop from the nozzle | Requires magnetic ink Ink colors other than black are difficult Requires very high magnetic fields | Silverbrook, EP 0771 658 A2 and related patent applications |
| Shutter | The actuator moves a shutter to block ink flow to the nozzle. The ink pressure is pulsed at a multiple of the drop ejection frequency. | High speed (>50 KHz) operation can be achieved due to reduced refill time Drop timing can be very accurate The actuator energy can be very low | Moving parts are required Requires ink pressure modulator Friction and wear must be considered Stiction is possible | IJ13, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 KHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | IJ10 |

AUXILIARY MECHANISM (APPLIED TO ALL NOZZLES)

| Auxiliary Mechanism | Description | Advantages | Disadvantages | Examples |
|---|---|---|---|---|
| None | The actuator directly fires the ink drop, and there is no external field or other mechanism required. | Simplicity of construction Simplicity of operation Small physical size | Drop ejection energy must be supplied by individual nozzle actuator | Most inkjets, including piezoelectric and thermal bubble. IJ01-IJ07, IJ09, IJ11 IJ12, IJ14, IJ20, IJ22 IJ23-IJ45 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | Oscillating ink pressure can provide a refill pulse, allowing higher operating speed The actuators may operate with much lower energy Acoustic lenses can be used to focus the sound on the nozzles | Requires external ink pressure oscillator Ink pressure phase and amplitude must be carefully controlled Acoustic reflections in the ink chamber must be designed for | Silverbrook, EP 0771 658 A2 and related patent applications IJ08, IJ13, IJ15, IJ17 IJ18, IJ19, IJ21 |
| Media proximity | The print head is placed in close | Low power High accuracy | Precision assembly required Paper fibers may cause problems | Silverbrook, EP 0771 658 A2 and related |

-continued

AUXILIARY MECHANISM (APPLIED TO ALL NOZZLES)

| Auxiliary Mechanism | Description | Advantages | Disadvantages | Examples |
|---|---|---|---|---|
| | proximity to the print medium. Selected drops protrude from the print head further than unselected drops, and contact the print medium. The drop soaks into the medium fast enough to cause drop separation. | Simple print head construction | Cannot print on rough substrates | patent applications |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric inkjet Any of the IJ series |
| Electrostatic | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | IJ06, IJ16 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | IJ10 |

ACTUATOR AMPLIFICATION OR MODIFICATION METHOD

| Actuator amplification | Description | Advantages | Disadvantages | Examples |
|---|---|---|---|---|
| None | No actuator mechanical amplification is used. The actuator directly drives the drop ejection process. | Operational simplicity | Many actuator mechanisms have insufficient travel, or insufficient force, to efficiently drive the drop ejection process | Thermal Bubble InkJet IJ01, IJ02, IJ06, IJ07 IJ16, IJ25, IJ26 |
| Differential expansion bend actuator | An actuator material expands more on one side than on the other. The expansion may be thermal, piezoelectric, magnetostrictive, or other mechanism. | Provides greater travel in a reduced print head area The bend actuator converts a high force low travel actuator mechanism to high travel, lower force mechanism. | High stresses are involved Care must be taken that the materials do not delaminate Residual bend resulting from high temperature or high stress during formation | Piezoelectric IJ03, IJ09, IJ17-IJ24 IJ27 IJ29-IJ39, IJ42, IJ43, IJ44 |
| Transient bend actuator | A trilayer bend actuator where the two outside layers are identical. This cancels bend due to ambient temperature and residual stress. | Very good temperature stability High speed, as a new drop can be fired before heat dissipates Cancels residual stress of formation | High stresses are involved Care must be taken that the materials do not delaminate | IJ40, IJ41 |

-continued

ACTUATOR AMPLIFICATION OR MODIFICATION METHOD

| Actuator amplification | Description | Advantages | Disadvantages | Examples |
|---|---|---|---|---|
| | The actuator only responds to transient heating of one side or the other. | | | |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets IJ04 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20 IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Reverse spring | The actuator loads a spring. When the actuator is turned off, the spring releases. This can reverse the force/distance curve of the actuator to make it compatible with the force/time requirements of the drop ejection. | Better coupling to the ink | Fabrication complexity High stress in the spring | IJ05, IJ11 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | Simple means of increasing travel of a bend actuator | Care must be taken not to exceed the elastic limit in the flexure area Stress distribution is very uneven Difficult to accurately model with finite element analysis | IJ10, IJ19, IJ33 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | IJ13 |
| Catch | The actuator controls a small catch. The catch either enables or disables movement of an ink pusher that is controlled in a bulk manner. | Very low actuator energy Very small actuator size | Complex construction Requires external force Unsuitable for pigmented inks | IJ10 |

-continued

ACTUATOR AMPLIFICATION OR MODIFICATION METHOD

| Actuator amplification | Description | Advantages | Disadvantages | Examples |
| --- | --- | --- | --- | --- |
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head . . . ", Proc. IEEE MEMS, February 1996, pp 418-423. IJ18, IJ27 |
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

| Actuator motion | Description | Advantages | Disadvantages | Examples |
| --- | --- | --- | --- | --- |
| Volume expansion | The volume of the actuator changes, pushing the ink in all directions. | Simple construction in the case of thermal ink jet | High energy is typically required to achieve volume expansion. This leads to thermal stress, cavitation, and kogation in thermal ink jet implementations | Hewlett-Packard Thermal InkJet Canon Bubblejet |
| Linear, normal to chip surface | The actuator moves in a direction normal to the print head surface. The nozzle is typically in the line of movement. | Efficient coupling to ink drops ejected normal to the surface | High fabrication complexity may be required to achieve perpendicular motion | IJ01, IJ02, IJ04, IJ07 IJ11, IJ14 |
| Linear, parallel to chip surface | The actuator moves parallel to the print head surface. Drop ejection may still be normal to the surface. | Suitable for planar fabrication | Fabrication complexity Friction Stiction | IJ12, IJ13, IJ15, IJ33, IJ34, IJ35, IJ36 |
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins U.S. Pat. No. 4,459,601 |

ACTUATOR MOTION -continued

| Actuator motion | Description | Advantages | Disadvantages | Examples |
|---|---|---|---|---|
| Rotary | The actuator causes the rotation of some element, such a grill or impeller | Rotary levers may be used to increase travel Small chip area requirements | Device complexity May have friction at a pivot point | IJ05, IJ08, IJ13, IJ28 |
| Bend | The actuator bends when energized. This may be due to differential thermal expansion, piezo-electric expansion, magnetostriction, or other form of relative dimensional change. | A very small change in dimensions can be converted to a large motion. | Requires the actuator to be made from at least two distinct layers, or to have a thermal difference across the actuator | 1970 Kyser et al U.S. Pat. No. 3,946,398 1973 Stemme U.S. Pat. No. 3,747,120 IJ03, IJ09, IJ10, IJ19 IJ23, IJ24, IJ25, IJ29 IJ30, IJ31, IJ33, IJ34 IJ35 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | IJ06 |
| Straighten | The actuator is normally bent, and straightens when energized. | Can be used with shape memory alloys where the austenic phase is planar | Requires careful balance of stresses to ensure that the quiescent bend is accurate | IJ26, IJ32 |
| Double bend | The actuator bends in one direction when one element is energized, and bends the other way when another element is energized. | One actuator can be used to power two nozzles. Reduced chip size. Not sensitive to ambient temperature | Difficult to make the drops ejected by both bend directions identical. A small efficiency loss compared to equivalent single bend actuators. | IJ36, IJ37, IJ38 |
| Shear | Energizing the actuator causes a shear motion in the actuator material. | Can increase the effective travel of piezoelectric actuators | Not readily applicable to other actuator mechanisms | 1985 Fishbeck U.S. Pat. No. 4,584,590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan U.S. Pat. No. 3,683,212 |
| Coil/uncoil | A coiled actuator uncoils or coils more tightly. The motion of the free end of the actuator ejects the ink. | Easy to fabricate as a planar VLSI process Small area required, therefore low cost | Difficult to fabricate for non-planar devices Poor out-of-plane stiffness | IJ17, IJ21, IJ34, IJ35 |
| Bow | The actuator bows (or buckles) in the middle when energized. | Can increase the speed of travel Mechanically rigid | Maximum travel is constrained High force required | IJ16, IJ18, IJ27 |
| Push-Pull | Two actuators control a shutter. One actuator pulls the shutter, and the other pushes it. | The structure is pinned at both ends, so has a high out-of-plane rigidity | Not readily suitable for inkjets which directly push the ink | IJ18 |
| Curl inwards | A set of actuators curl inwards to reduce the volume of ink that they enclose. | Good fluid flow to the region behind the actuator increases efficiency | Design complexity | IJ20, IJ42 |
| Curl outwards | A set of actuators curl outwards, pressurizing ink in a chamber surrounding the actuators, and expelling ink from a nozzle in the chamber. | Relatively simple construction | Relatively large chip area | IJ43 |
| Iris | Multiple vanes enclose a volume of ink. These simultaneously rotate, | High efficiency Small chip area | High fabrication complexity Not suitable for pigmented inks | IJ22 |

ACTUATOR MOTION

| Actuator motion | Description | Advantages | Disadvantages | Examples |
| --- | --- | --- | --- | --- |
| | reducing the volume between the vanes. | | | |
| Acoustic vibration | The actuator vibrates at a high frequency. | The actuator can be physically distant from the ink | Large area required for efficient operation at useful frequencies<br>Acoustic coupling and crosstalk<br>Complex drive circuitry<br>Poor control of drop volume and position | 1993 Hadimioglu et al, EUP 550,192<br>1993 Elrod et al, EUP 572,220 |
| None | In various ink jet designs the actuator does not move. | No moving parts | Various other tradeoffs are required to eliminate moving parts | Silverbrook, EP 0771 658 A2 and related patent applications<br>Tone-jet |

NOZZLE REFILL METHOD

| Nozzle refill method | Description | Advantages | Disadvantages | Examples |
| --- | --- | --- | --- | --- |
| Surface tension | After the actuator is energized, it typically returns rapidly to its normal position. This rapid return sucks in air through the nozzle opening. The ink surface tension at the nozzle then exerts a small force restoring the meniscus to a minimum area. | Fabrication simplicity<br>Operational simplicity | Low speed<br>Surface tension force relatively small compared to actuator force<br>Long refill time usually dominates the total repetition rate | Thermal inkjet<br>Piezoelectric inkjet<br>IJ01-IJ07, IJ10-IJ14<br>IJ16, IJ20, IJ22-IJ45 |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. | High speed<br>Low actuator energy, as the actuator need only open or close the shutter, instead of ejecting the ink drop | Requires common ink pressure oscillator<br>May not be suitable for pigmented inks | IJ08, IJ13, IJ15, IJ17 IJ18, IJ19, IJ21 |
| Refill actuator | After the main actuator has ejected a drop a second (refill) actuator is energized. The refill actuator pushes ink into the nozzle chamber. The refill actuator returns slowly, to prevent its return from emptying the chamber again. | High speed, as the nozzle is actively refilled | Requires two independent actuators per nozzle | IJ09 |
| Positive ink pressure | The ink is held a slight positive pressure. After the ink drop is ejected, the nozzle chamber fills quickly as surface tension and ink pressure both operate to refill the nozzle. | High refill rate, therefore a high drop repetition rate is possible | Surface spill must be prevented<br>Highly hydrophobic print head surfaces are required | Silverbrook, EP 0771 658 A2 and related patent applications<br>Alternative for:<br>IJ01-IJ07, IJ10-IJ14<br>IJ16, IJ20, IJ22-IJ45 |

| METHOD OF RESTRICTING BACK-FLOW THROUGH INLET | | | | |
|---|---|---|---|---|
| Inlet back-flow restriction method | Description | Advantages | Disadvantages | Examples |
| Long inlet channel | The ink inlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective | Thermal inkjet Piezoelectric inkjet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | Requires a method (such as a nozzle rim or effective hydrophobizing, or both) to prevent flooding of the ejection surface of the print head. | Silverbrook, EP 0771 658 A2 and related patent applications Possible operation of the following: IJ01-IJ07, IJ09-IJ12 IJ14, IJ16, IJ20, IJ22, IJ23-IJ34, IJ36-IJ41 IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric inkjet |
| Flexible flap restricts inlet | In this method recently disclosed by Canon, the expanding actuator (bubble) pushes on a flexible flap that restricts the inlet. | Significantly reduces back-flow for edge-shooter thermal ink jet devices | Not applicable to most inkjet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | IJ04, IJ12, IJ24, IJ27 IJ29, IJ30 |
| Small inlet compared to nozzle | The ink inlet channel to the nozzle chamber has a substantially smaller cross section than that of the nozzle, resulting in easier ink egress out of the nozzle than out of the inlet. | Design simplicity | Restricts refill rate May result in a relatively large chip area Only partially effective | IJ02, IJ37, IJ44 |
| Inlet shutter | A secondary actuator controls the position of a shutter, closing off the ink inlet when the main actuator is energized. | Increases speed of the inkjet print head operation | Requires separate refill actuator and drive circuit | IJ09 |

-continued

METHOD OF RESTRICTING BACK-FLOW THROUGH INLET

| Inlet back-flow restriction method | Description | Advantages | Disadvantages | Examples |
|---|---|---|---|---|
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06 IJ07, IJ10, IJ11, IJ14 IJ16, IJ22, IJ23, IJ25 IJ28, IJ31, IJ32, IJ33 IJ34, IJ35, IJ36, IJ39 IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet IJ08, IJ13, IJ15, IJ17 IJ18, IJ19, IJ21 |

NOZZLE CLEARING METHOD

| Nozzle Clearing method | Description | Advantages | Disadvantages | Examples |
|---|---|---|---|---|
| Normal nozzle firing | All of the nozzles are fired periodically, before the ink has a chance to dry. When not in use the nozzles are sealed (capped) against air. The nozzle firing is usually performed during a special clearing cycle, after first moving the print head to a cleaning station. | No added complexity on the print head | May not be sufficient to displace dried ink | Most ink jet systems IJ01-IJ07, IJ09-IJ12 IJ14, IJ16, IJ20, IJ22 IJ23-IJ34, IJ36-IJ45 |
| Extra power to ink heater | In systems which heat the ink, but do not boil it under normal situations, nozzle clearing can be achieved by over-powering the heater and boiling ink at the nozzle. | Can be highly effective if the heater is adjacent to the nozzle | Requires higher drive voltage for clearing May require larger drive transistors | Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | Does not require extra drive circuits on the print head Can be readily controlled and initiated by digital logic | Effectiveness depends substantially upon the configuration of the inkjet nozzle | May be used with: IJ01-IJ07, IJ09-IJ11 IJ14, IJ16, IJ20, IJ22 IJ23-IJ25, IJ27-IJ34 IJ36-IJ45 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: IJ03, IJ09, IJ16, IJ20 IJ23, IJ24, IJ25, IJ27 IJ29, IJ30, IJ31, IJ32 IJ39, IJ40, IJ41, IJ42 IJ43, IJ44, IJ45 |

NOZZLE CLEARING METHOD

| Nozzle Clearing method | Description | Advantages | Disadvantages | Examples |
| --- | --- | --- | --- | --- |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved May be implemented at very low cost in systems which already include acoustic actuators | High implementation cost if system does not already include an acoustic actuator | IJ08, IJ13, IJ15, IJ17 IJ18, IJ19, IJ21 |
| Nozzle clearing plate | A microfabricated plate is pushed against the nozzles. The plate has a post for every nozzle. The array of posts | Can clear severely clogged nozzles | Accurate mechanical alignment is required Moving parts are required There is risk of damage to the nozzles Accurate fabrication is required | Silverbrook, EP 0771 658 A2 and related patent applications |
| Ink pressure pulse | The pressure of the ink is temporarily increased so that ink streams from all of the nozzles. This may be used in conjunction with actuator energizing. | May be effective where other methods cannot be used | Requires pressure pump or other pressure actuator Expensive Wasteful of ink | May be used with all IJ series ink jets |
| Print head wiper | A flexible 'blade' is wiped across the print head surface. The blade is usually fabricated from a flexible polymer, e.g. rubber or synthetic elastomer. | Effective for planar print head surfaces Low cost | Difficult to use if print head surface is non-planar or very fragile Requires mechanical parts Blade can wear out in high volume print systems | Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required. | Can be effective where other nozzle clearing methods cannot be used Can be implemented at no additional cost in some inkjet configurations | Fabrication complexity | Can be used with many IJ series ink jets |

NOZZLE PLATE CONSTRUCTION

| Nozzle plate construction | Description | Advantages | Disadvantages | Examples |
| --- | --- | --- | --- | --- |
| Electroformed nickel | A nozzle plate is separately fabricated from electroformed nickel, and bonded to the print head chip. | Fabrication simplicity | High temperatures and pressures are required to bond nozzle plate Minimum thickness constraints Differential thermal expansion | Hewlett Packard Thermal Inkjet |
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol. 998 Excimer Beam Applications, pp. 76-83 1993 Watanabe et al., U.S. Pat. No. 5,208,604 |
| Silicon micromachined | A separate nozzle plate is micromachined from single crystal | High accuracy is attainable | Two part construction High cost Requires precision alignment | K. Bean, IEEE Transactions on Electron Devices, Vol. |

-continued

NOZZLE PLATE CONSTRUCTION

| Nozzle plate construction | Description | Advantages | Disadvantages | Examples |
| --- | --- | --- | --- | --- |
| | silicon, and bonded to the print head wafer. | | Nozzles may be clogged by adhesive | ED-25, No. 10, 1978, pp 1185-1195 Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | No expensive equipment required Simple to make single nozzles | Very small nozzle sizes are difficult to form Not suited for mass production | 1970 Zoltan U.S. Pat. No. 3,683,212 |
| Monolithic, surface micro-machined using VLSI lithographic processes | The nozzle plate is deposited as a layer using standard VLSI deposition techniques. Nozzles are etched in the nozzle plate using VLSI lithography and etching. | High accuracy (<1 μm) Monolithic Low cost Existing processes can be used | Requires sacrificial layer under the nozzle plate to form the nozzle chamber Surface may be fragile to the touch | Silverbrook, EP 0771 658 A2 and related patent applications IJ01, IJ02, IJ04, IJ11 IJ12, IJ17, IJ18, IJ20 IJ22, IJ24, IJ27, IJ28 IJ29, IJ30, IJ31, IJ32 IJ33, IJ34, IJ36, IJ37 IJ38, IJ39, IJ40, IJ41 IJ42, IJ43, IJ44 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | High accuracy (<1 μm) Monolithic Low cost No differential expansion | Requires long etch times Requires a support wafer | IJ03, IJ05, IJ06, IJ07 IJ08, IJ09, IJ10, IJ13 IJ14, IJ15, IJ16, IJ19 IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al U.S. Pat. No. 5,412,413 1993 Hadimioglu et al EUP 550,192 1993 Elrod et al EUP 572,220 |
| Trough | Each drop ejector has a trough through which a paddle moves. There is no nozzle plate. | Reduced manufacturing complexity Monolithic | Drop firing direction is sensitive to wicking. | IJ35 |
| Nozzle slit instead of individual nozzles | The elimination of nozzle holes and replacement by a slit encompassing many actuator positions reduces nozzle clogging, but increases crosstalk due to ink surface waves | No nozzles to become clogged | Difficult to control drop position accurately Crosstalk problems | 1989 Saito et al U.S. Pat. No. 4,799,068 |

DROP EJECTION DIRECTION

| Ejection direction | Description | Advantages | Disadvantages | Examples |
| --- | --- | --- | --- | --- |
| Edge ('edge shooter') | Ink flow is along the surface of the chip, | Simple construction No silicon etching required | Nozzles limited to edge High resolution is difficult | Canon Bubblejet 1979 Endo et al GB patent |

DROP EJECTION DIRECTION

| Ejection direction | Description | Advantages | Disadvantages | Examples |
| --- | --- | --- | --- | --- |
| | and ink drops are ejected from the chip edge. | Good heat sinking via substrate<br>Mechanically strong<br>Ease of chip handing | Fast color printing requires one print head per color | 2,007,162<br>Xerox heater-in-pit 1990<br>Hawkins et al U.S. Pat. No. 4,899,181<br>Tone-jet |
| Surface ('roof shooter') | Ink flow is along the surface of the chip, and ink drops are ejected from the chip surface, normal to the plane of the chip. | No bulk silicon etching required<br>Silicon can make an effective heat sink<br>Mechanical strength | Maximum ink flow is severely restricted | Hewlett-Packard TIJ 1982 Vaught et al U.S. Pat. No. 4,490,728<br>IJ02, IJ11, IJ12, IJ20 IJ22 |
| Through chip, forward ('up shooter') | Ink flow is through the chip, and ink drops are ejected from the front surface of the chip. | High ink flow<br>Suitable for pagewidth print<br>High nozzle packing density therefore low manufacturing cost | Requires bulk silicon etching | Silverbrook, EP 0771 658 A2 and related patent applications<br>IJ04, IJ17, IJ18, IJ24 IJ27-IJ45 |
| Through chip, reverse ('down shooter') | Ink flow is through the chip, and ink drops are ejected from the rear surface of the chip. | High ink flow<br>Suitable for pagewidth print<br>High nozzle packing density therefore low manufacturing cost | Requires wafer thinning<br>Requires special handling during manufacture | IJ01, IJ03, IJ05, IJ06<br>IJ07, IJ08, IJ09, IJ10<br>IJ13, IJ14, IJ15, IJ16<br>IJ19, IJ21, IJ23, IJ25<br>IJ26 |
| Through actuator | Ink flow is through the actuator, which is not fabricated as part of the same substrate as the drive transistors. | Suitable for piezoelectric print heads | Pagewidth print heads require several thousand connections to drive circuits<br>Cannot be manufactured in standard CMOS fabs<br>Complex assembly required | Epson Stylus<br>Tektronix hot melt piezoelectric ink jets |

INK TYPE

| Ink type | Description | Advantages | Disadvantages | Examples |
| --- | --- | --- | --- | --- |
| Aqueous, dye | Water based ink which typically contains: water, dye, surfactant, humectant, and biocide.<br>Modern ink dyes have high water-fastness, light fastness | Environmentally friendly<br>No odor | Slow drying<br>Corrosive<br>Bleeds on paper<br>May strikethrough<br>Cockles paper | Most existing inkjets<br>All IJ series ink jets<br>Silverbrook, EP 0771 658 A2 and related patent applications |
| Aqueous, pigment | Water based ink which typically contains: water, pigment, surfactant, humectant, and biocide.<br>Pigments have an advantage in reduced bleed, wicking and strikethrough. | Environmentally friendly<br>No odor<br>Reduced bleed<br>Reduced wicking<br>Reduced strikethrough | Slow drying<br>Corrosive<br>Pigment may clog nozzles<br>Pigment may clog actuator mechanisms<br>Cockles paper | IJ02, IJ04, IJ21, IJ26<br>IJ27, IJ30<br>Silverbrook, EP 0771 658 A2 and related patent applications<br>Piezoelectric ink-jets<br>Thermal ink jets (with significant restrictions) |
| Methyl Ethyl Ketone (MEK) | MEK is a highly volatile solvent used for industrial printing on difficult surfaces such as aluminum cans. | Very fast drying<br>Prints on various substrates such as metals and plastics | Odorous<br>Flammable | All IJ series ink jets |
| Alcohol (ethanol, 2-butanol, and others) | Alcohol based inks can be used where the printer must operate at temperatures below the freezing point of water. An example of this is in-camera consumer photographic printing. | Fast drying<br>Operates at sub-freezing temperatures<br>Reduced paper cockle<br>Low cost | Slight odor<br>Flammable | All IJ series ink jets |
| Phase change (hot melt) | The ink is solid at room temperature, and | No drying time - ink instantly freezes on the print medium | High viscosity<br>Printed ink typically has a 'waxy' feel | Tektronix hot melt piezoelectric ink jets |

-continued

INK TYPE

| Ink type | Description | Advantages | Disadvantages | Examples |
| --- | --- | --- | --- | --- |
| | is melted in the print head before jetting. Hot melt inks are usually wax based, with a melting point around 80° C. After jetting the ink freezes almost instantly upon contacting the print medium or a transfer roller. | Almost any print medium can be used<br>No paper cockle occurs<br>No wicking occurs<br>No bleed occurs<br>No strikethrough occurs | Printed pages may 'block'<br>Ink temperature may be above the curie point of permanent magnets<br>Ink heaters consume power<br>Long warm-up time | 1989 Nowak U.S. Pat. No. 4,820,346<br>All IJ series ink jets |
| Oil | Oil based inks are extensively used in offset printing. They have advantages in improved characteristics on paper (especially no wicking or cockle). Oil soluble dies and pigments are required. | High solubility medium for some dyes<br>Does not cockle paper<br>Does not wick through paper | High viscosity: this is a significant limitation for use in inkjets, which usually require a low viscosity. Some short chain and multi-branched oils have a sufficiently low viscosity.<br>Slow drying | All IJ series ink jets |
| Microemulsion | A microemulsion is a stable, self forming emulsion of oil, water, and surfactant. The characteristic drop size is less than 100 nm, and is determined by the preferred curvature of the surfactant. | Stops ink bleed<br>High dye solubility<br>Water, oil, and amphiphilic soluble dies can be used<br>Can stabilize pigment suspensions | Viscosity higher than water<br>Cost is slightly higher than water based ink<br>High surfactant concentration required (around 5%) | All IJ series ink jets |

Ink Jet Printing

A large number of new forms of ink jet printers have been developed to facilitate alternative ink jet technologies for the image processing and data distribution system. Various combinations of ink jet devices can be included in printer devices incorporated as part of the present invention. Australian Provisional Patent Applications relating to these ink jets which are specifically incorporated by cross reference. The serial numbers of respective corresponding U.S. patent applications are also provided for the sake of convenience.

| Australian Provisional Number | Filing Date | Title | U.S. Pat. No./Patent application and Filing Date |
| --- | --- | --- | --- |
| PO8066 | 15 Jul. 1997 | Image Creation Method and Apparatus (IJ01) | 6,227,652 (Jul. 10, 1998) |
| PO8072 | 15 Jul. 1997 | Image Creation Method and Apparatus (IJ02) | 6,213,588 (Jul. 10, 1998) |
| PO8040 | 15 Jul. 1997 | Image Creation Method and Apparatus (IJ03) | 6,213,589 (Jul. 10, 1998) |
| PO8071 | 15 Jul. 1997 | Image Creation Method and Apparatus (IJ04) | 6,231,163 (Jul. 10, 1998) |
| PO8047 | 15 Jul. 1997 | Image Creation Method and Apparatus (IJ05) | 6,247,795 (Jul. 10, 1998) |
| PO8035 | 15 Jul. 1997 | Image Creation Method and Apparatus (IJ06) | 6,394,581 (Jul. 10, 1998) |
| PO8044 | 15 Jul. 1997 | Image Creation Method and Apparatus (IJ07) | 6,244,691 (Jul. 10, 1998) |
| PO8063 | 15 Jul. 1997 | Image Creation Method and Apparatus (IJ08) | 6,257,704 (Jul. 10, 1998) |
| PO8057 | 15 Jul. 1997 | Image Creation Method and Apparatus (IJ09) | 6,416,168 (Jul. 10, 1998) |
| PO8056 | 15 Jul. 1997 | Image Creation Method and Apparatus (IJ10) | 6,220,694 (Jul. 10, 1998) |
| PO8069 | 15 Jul. 1997 | Image Creation Method and Apparatus (IJ11) | 6,257,705 (Jul. 10, 1998) |
| PO8049 | 15 Jul. 1997 | Image Creation Method and Apparatus (IJ12) | 6,247,794 (Jul. 10, 1998) |
| PO8036 | 15 Jul. 1997 | Image Creation Method and Apparatus (IJ13) | 6,234,610 (Jul. 10, 1998) |
| PO8048 | 15 Jul. 1997 | Image Creation Method and Apparatus (IJ14) | 6,247,793 (Jul. 10, 1998) |
| PO8070 | 15 Jul. 1997 | Image Creation Method and Apparatus (IJ15) | 6,264,306 (Jul. 10, 1998) |
| PO8067 | 15 Jul. 1997 | Image Creation Method and Apparatus (IJ16) | 6,241,342 (Jul. 10, 1998) |
| PO8001 | 15 Jul. 1997 | Image Creation Method and Apparatus (IJ17) | 6,247,792 (Jul. 10, 1998) |
| PO8038 | 15 Jul. 1997 | Image Creation Method and Apparatus (IJ18) | 6,264,307 (Jul. 10, 1998) |
| PO8033 | 15 Jul. 1997 | Image Creation Method and Apparatus (IJ19) | 6,254,220 (Jul. 10, 1998) |
| PO8002 | 15 Jul. 1997 | Image Creation Method and Apparatus (IJ20) | 6,234,611 (Jul. 10, 1998) |
| PO8068 | 15 Jul. 1997 | Image Creation Method and Apparatus (IJ21) | 6,302,528 (Jul. 10, 1998) |
| PO8062 | 15 Jul. 1997 | Image Creation Method and Apparatus (IJ22) | 6,283,582 (Jul. 10, 1998) |
| PO8034 | 15 Jul. 1997 | Image Creation Method and Apparatus (IJ23) | 6,239,821 (Jul. 10, 1998) |
| PO8039 | 15 Jul. 1997 | Image Creation Method and Apparatus (IJ24) | 6,338,547 (Jul. 10, 1998) |

-continued

| Australian Provisional Number | Filing Date | Title | U.S. Pat. No./Patent application and Filing Date |
|---|---|---|---|
| PO8041 | 15 Jul. 1997 | Image Creation Method and Apparatus (IJ25) | 6,247,796 (Jul. 10, 1998) |
| PO8004 | 15 Jul. 1997 | Image Creation Method and Apparatus (IJ26) | 09/113,122 (Jul. 10, 1998) |
| PO8037 | 15 Jul. 1997 | Image Creation Method and Apparatus (IJ27) | 6,390,603 (Jul. 10, 1998) |
| PO8043 | 15 Jul. 1997 | Image Creation Method and Apparatus (IJ28) | 6,362,843 (Jul. 10, 1998) |
| PO8042 | 15 Jul. 1997 | Image Creation Method and Apparatus (IJ29) | 6,293,653 (Jul. 10, 1998) |
| PO8064 | 15 Jul. 1997 | Image Creation Method and Apparatus (IJ30) | 6,312,107 (Jul. 10, 1998) |
| PO9389 | 23 Sep. 1997 | Image Creation Method and Apparatus (IJ31) | 6,227,653 (Jul. 10, 1998) |
| PO9391 | 23 Sep. 1997 | Image Creation Method and Apparatus (IJ32) | 6,234,609 (Jul. 10, 1998) |
| PP0888 | 12 Dec. 1997 | Image Creation Method and Apparatus (IJ33) | 6,238,040 (Jul. 10, 1998) |
| PP0891 | 12 Dec. 1997 | Image Creation Method and Apparatus (IJ34) | 6,188,415 (Jul. 10, 1998) |
| PP0890 | 12 Dec. 1997 | Image Creation Method and Apparatus (IJ35) | 6,227,654 (Jul. 10, 1998) |
| PP0873 | 12 Dec. 1997 | Image Creation Method and Apparatus (IJ36) | 6,209,989 (Jul. 10, 1998) |
| PP0993 | 12 Dec. 1997 | Image Creation Method and Apparatus (IJ37) | 6,247,791 (Jul. 10, 1998) |
| PP0890 | 12 Dec. 1997 | Image Creation Method and Apparatus (IJ38) | 6,336,710 (Jul. 10, 1998) |
| PP1398 | 19 Jan. 1998 | An Image Creation Method and Apparatus (IJ39) | 6,217,153 (Jul. 10, 1998) |
| PP2592 | 25 Mar. 1998 | An Image Creation Method and Apparatus (IJ40) | 6,416,167 (Jul. 10, 1998) |
| PP2593 | 25 Mar. 1998 | Image Creation Method and Apparatus (IJ41) | 6,243,113 (Jul. 10, 1998) |
| PP3991 | 9 Jun. 1998 | Image Creation Method and Apparatus (IJ42) | 6,283,581 (Jul. 10, 1998) |
| PP3987 | 9 Jun. 1998 | Image Creation Method and Apparatus (IJ43) | 6,247,790 (Jul. 10, 1998) |
| PP3985 | 9 Jun. 1998 | Image Creation Method and Apparatus (IJ44) | 6,260,953 (Jul. 10, 1998) |
| PP3983 | 9 Jun. 1998 | Image Creation Method and Apparatus (IJ45) | 6,267,469 (Jul. 10, 1998) |

Ink Jet Manufacturing

Further, the present application may utilize advanced semiconductor fabrication techniques in the construction of large arrays of ink jet printers. Suitable manufacturing techniques are described in the following Australian provisional patent specifications incorporated here by cross-reference. The serial numbers of respective corresponding U.S. patent applications are also provided for the sake of convenience.

| Australian Provisional Number | Filing Date | Title | U.S. Pat. No./Patent application and Filing Date |
|---|---|---|---|
| PO7935 | 15 Jul. 1997 | A Method of Manufacture of an Image Creation Apparatus (IJM01) | 6,224,780 (Jul. 10, 1998) |
| PO7936 | 15 Jul. 1997 | A Method of Manufacture of an Image Creation Apparatus (IJM02) | 6,235,212 (Jul. 10, 1998) |
| PO7937 | 15 Jul. 1997 | A Method of Manufacture of an Image Creation Apparatus (IJM03) | 6,280,643 (Jul. 10, 1998) |
| PO8061 | 15 Jul. 1997 | A Method of Manufacture of an Image Creation Apparatus (IJM04) | 6,284,147 (Jul. 10, 1998) |
| PO8054 | 15 Jul. 1997 | A Method of Manufacture of an Image Creation Apparatus (IJM05) | 6,214,244 (Jul. 10, 1998) |
| PO8065 | 15 Jul. 1997 | A Method of Manufacture of an Image Creation Apparatus (IJM06) | 6,071,750 (Jul. 10, 1998) |
| PO8055 | 15 Jul. 1997 | A Method of Manufacture of an Image Creation Apparatus (IJM07) | 6,267,905 (Jul. 10, 1998) |
| PO8053 | 15 Jul. 1997 | A Method of Manufacture of an Image Creation Apparatus (IJM08) | 6,251,298 (Jul. 10, 1998) |
| PO8078 | 15 Jul. 1997 | A Method of Manufacture of an Image Creation Apparatus (IJM09) | 6,258,285 (Jul. 10, 1998) |
| PO7933 | 15 Jul. 1997 | A Method of Manufacture of an Image Creation Apparatus (IJM10) | 6,225,138 (Jul. 10, 1998) |
| PO7950 | 15 Jul. 1997 | A Method of Manufacture of an Image Creation Apparatus (IJM11) | 6,241,904 (Jul. 10, 1998) |
| PO7949 | 15 Jul. 1997 | A Method of Manufacture of an Image Creation Apparatus (IJM12) | 6,299,786 (Jul. 10, 1998) |
| PO8060 | 15 Jul. 1997 | A Method of Manufacture of an Image Creation Apparatus (IJM13) | 09/113,124 (Jul. 10, 1998) |
| PO8059 | 15 Jul. 1997 | A Method of Manufacture of an Image Creation Apparatus (IJM14) | 6,231,773 (Jul. 10, 1998) |
| PO8073 | 15 Jul. 1997 | A Method of Manufacture of an Image Creation Apparatus (IJM15) | 6,190,931 (Jul. 10, 1998) |
| PO8076 | 15 Jul. 1997 | A Method of Manufacture of an Image Creation Apparatus (IJM16) | 6,248,249 (Jul. 10, 1998) |
| PO8075 | 15 Jul. 1997 | A Method of Manufacture of an Image Creation Apparatus (IJM17) | 6,290,862 (Jul. 10, 1998) |
| PO8079 | 15 Jul. 1997 | A Method of Manufacture of an Image Creation Apparatus (IJM18) | 6,241,906 (Jul. 10, 1998) |
| PO8050 | 15 Jul. 1997 | A Method of Manufacture of an Image Creation Apparatus (IJM19) | 09/113,116 (Jul. 10, 1998) |
| PO8052 | 15 Jul. 1997 | A Method of Manufacture of an Image Creation Apparatus (IJM20) | 6,241,905 (Jul. 10, 1998) |
| PO7948 | 15 Jul. 1997 | A Method of Manufacture of an Image Creation Apparatus (IJM21) | 6,451,216 (Jul. 10, 1998) |
| PO7951 | 15 Jul. 1997 | A Method of Manufacture of an Image Creation Apparatus (IJM22) | 6,231,772 (Jul. 10, 1998) |
| PO8074 | 15 Jul. 1997 | A Method of Manufacture of an Image Creation Apparatus (IJM23) | 6,274,056 (Jul. 10, 1998) |
| PO7941 | 15 Jul. 1997 | A Method of Manufacture of an Image Creation Apparatus (IJM24) | 6,290,861 (Jul. 10, 1998) |
| PO8077 | 15 Jul. 1997 | A Method of Manufacture of an Image Creation Apparatus (IJM25) | 6,248,248 (Jul. 10, 1998) |
| PO8058 | 15 Jul. 1997 | A Method of Manufacture of an Image Creation Apparatus (IJM26) | 6,306,671 (Jul. 10, 1998) |

-continued

| Australian Provisional Number | Filing Date | Title | U.S. Pat. No./Patent application and Filing Date |
|---|---|---|---|
| PO8051 | 15 Jul. 1997 | A Method of Manufacture of an Image Creation Apparatus (IJM27) | 6,331,258 (Jul. 10, 1998) |
| PO8045 | 15 Jul. 1997 | A Method of Manufacture of an Image Creation Apparatus (IJM28) | 6,110,754 (Jul. 10, 1998) |
| PO7952 | 15 Jul. 1997 | A Method of Manufacture of an Image Creation Apparatus (IJM29) | 6,294,101 (Jul. 10, 1998) |
| PO8046 | 15 Jul. 1997 | A Method of Manufacture of an Image Creation Apparatus (IJM30) | 6,416,679 (Jul. 10, 1998) |
| PO8503 | 11 Aug. 1997 | A Method of Manufacture of an Image Creation Apparatus (IJM30a) | 6,264,849 (Jul. 10, 1998) |
| PO9390 | 23 Sep. 1997 | A Method of Manufacture of an Image Creation Apparatus (IJM31) | 6,254,793 (Jul. 10, 1998) |
| PO9392 | 23 Sep. 1997 | A Method of Manufacture of an Image Creation Apparatus (IJM32) | 6,235,211 (Jul. 10, 1998) |
| PP0889 | 12 Dec. 1997 | A Method of Manufacture of an Image Creation Apparatus (IJM35) | 6,235,211 (Jul. 10, 1998) |
| PP0887 | 12 Dec. 1997 | A Method of Manufacture of an Image Creation Apparatus (IJM36) | 6,264,850 (Jul. 10, 1998) |
| PP0882 | 12 Dec. 1997 | A Method of Manufacture of an Image Creation Apparatus (IJM37) | 6,258,284 (Jul. 10, 1998) |
| PP0874 | 12 Dec. 1997 | A Method of Manufacture of an Image Creation Apparatus (IJM38) | 6,258,284 (Jul. 10, 1998) |
| PP1396 | 19 Jan. 1998 | A Method of Manufacture of an Image Creation Apparatus (IJM39) | 6,228,668 (Jul. 10, 1998) |
| PP2591 | 25 Mar. 1998 | A Method of Manufacture of an Image Creation Apparatus (IJM41) | 6,180,427 (Jul. 10, 1998) |
| PP3989 | 9 Jun. 1998 | A Method of Manufacture of an Image Creation Apparatus (IJM40) | 6,171,875 (Jul. 10, 1998) |
| PP3990 | 9 Jun. 1998 | A Method of Manufacture of an Image Creation Apparatus (IJM42) | 6,267,904 (Jul. 10, 1998) |
| PP3986 | 9 Jun. 1998 | A Method of Manufacture of an Image Creation Apparatus (IJM43) | 6,245,247 (Jul. 10, 1998) |
| PP3984 | 9 Jun. 1998 | A Method of Manufacture of an Image Creation Apparatus (IJM44) | 6,245,247 (Jul. 10, 1998) |
| PP3982 | 9 Jun. 1998 | A Method of Manufacture of an Image Creation Apparatus (IJM45) | 6,231,148 (Jul. 10, 1998) |

Fluid Supply

Further, the present application may utilize an ink delivery system to the ink jet head. Delivery systems relating to the supply of ink to a series of ink jet nozzles are described in the following Australian provisional patent specifications, the disclosure of which are hereby incorporated by cross-reference. The serial numbers of respective corresponding U.S. patent applications are also provided for the sake of convenience.

| Australian Provisional Number | Filing Date | Title | U.S. Pat. No./Patent application and Filing Date |
|---|---|---|---|
| PO8003 | 15 Jul. 1997 | Supply Method and Apparatus (F1) | 6,350,023 (Jul. 10, 1998) |
| PO8005 | 15 Jul. 1997 | Supply Method and Apparatus (F2) | 6,318,849 (Jul. 10, 1998) |
| PO9404 | 23 Sep. 1997 | A Device and Method (F3) | 09/113,101 (Jul. 10, 1998) |

MEMS Technology

Further, the present application may utilize advanced semiconductor microelectromechanical techniques in the construction of large arrays of ink jet printers. Suitable microelectromechanical techniques are described in the following Australian provisional patent specifications incorporated here by cross-reference. The serial numbers of respective corresponding US patent applications are also provided for the sake of convenience.

| Australian Provisional Number | Filing Date | Title | U.S. Pat. No./Patent application and Filing Date |
|---|---|---|---|
| PO7943 | 15 Jul. 1997 | A device (MEMS01) | |
| PO8006 | 15 Jul. 1997 | A device (MEMS02) | 6,087,638 (Jul. 10, 1998) |
| PO8007 | 15 Jul. 1997 | A device (MEMS03) | 09/113,093 (Jul. 10, 1998) |
| PO8008 | 15 Jul. 1997 | A device (MEMS04) | 6,340,222 (Jul. 10, 1998) |
| PO8010 | 15 Jul. 1997 | A device (MEMS05) | 6,041,600 (Jul. 10, 1998) |
| PO8011 | 15 Jul. 1997 | A device (MEMS06) | 6,299,300 (Jul. 10, 1998) |
| PO7947 | 15 Jul. 1997 | A device (MEMS07) | 6,067,797 (Jul. 10, 1998) |
| PO7945 | 15 Jul. 1997 | A device (MEMS08) | 09/113,081 (Jul. 10, 1998) |
| PO7944 | 15 Jul. 1997 | A device (MEMS09) | 6,286,935 (Jul. 10, 1998) |
| PO7946 | 15 Jul. 1997 | A device (MEMS10) | 6,044,646 (Jul. 10, 1998) |
| PO9393 | 23 Sep. 1997 | A Device and Method (MEMS11) | 09/113,065 (Jul. 10, 1998) |
| PP0875 | 12 Dec. 1997 | A device (MEMS12) | 09/113,078 (Jul. 10, 1998) |
| PP0894 | 12 Dec. 1997 | A Device and Method (MEMS13) | 09/113,075 (Jul. 10, 1998) |

IR Technologies

Further, the present application may include the utilization of a disposable camera system such as those described in the following Australian provisional patent specifications incorporated here by cross-reference. The serial numbers of respective corresponding U.S. patent applications are also provided for the sake of convenience.

| Australian Provisional Number | Filing Date | Title | U.S. Pat. No./Patent application and Filing Date |
|---|---|---|---|
| PP0895 | 12 Dec. 1997 | An Image Creation Method and Apparatus (IR01) | 6,231,148 (Jul. 10, 1998) |

-continued

| Australian Provisional Number | Filing Date | Title | U.S. Pat. No./Patent application and Filing Date |
|---|---|---|---|
| PP0870 | 12 Dec. 1997 | A Device and Method (IR02) | 09/113,106 (Jul. 10, 1998) |
| PP0869 | 12 Dec. 1997 | A Device and Method (IR04) | 6,293,658 (Jul. 10, 1998) |
| PP0887 | 12 Dec. 1997 | Image Creation Method and Apparatus (IR05) | 09/113,104 (Jul. 10, 1998) |
| PP0885 | 12 Dec. 1997 | An Image Production System (IR06) | 6,238,033 (Jul. 10, 1998) |
| PP0884 | 12 Dec. 1997 | Image Creation Method and Apparatus (IR10) | 6,312,070 (Jul. 10, 1998) |
| PP0886 | 12 Dec. 1997 | Image Creation Method and Apparatus (IR12) | 6,238,111 (Jul. 10, 1998) |
| PP0871 | 12 Dec. 1997 | A Device and Method (IR13) | 09/113,086 (Jul. 10, 1998) |
| PP0876 | 12 Dec. 1997 | An Image Processing Method and Apparatus (IR14) | 09/113,094 (Jul. 10, 1998) |
| PP0877 | 12 Dec. 1997 | A Device and Method (IR16) | 6,378,970 (Jul. 10, 1998) |
| PP0878 | 12 Dec. 1997 | A Device and Method (IR17) | 6,196,739 (Jul. 10, 1998) |
| PP0879 | 12 Dec. 1997 | A Device and Method (IR18) | 09/112,774 (Jul. 10, 1998) |
| PP0883 | 12 Dec. 1997 | A Device and Method (IR19) | 6,270,182 (Jul. 10, 1998) |
| PP0880 | 12 Dec. 1997 | A Device and Method (IR20) | 6,152,619 (Jul. 10, 1998) |
| PP0881 | 12 Dec. 1997 | A Device and Method (IR21) | 09/113,092 (Jul. 10, 1998) |

DotCard Technologies

Further, the present application may include the utilization of a data distribution system such as that described in the following Australian provisional patent specifications incorporated here by cross-reference. The serial numbers of respective corresponding U.S. patent applications are also provided for the sake of convenience.

| Australian Provisional Number | Filing Date | Title | U.S. Pat. No./Patent application and Filing Date |
|---|---|---|---|
| PP2370 | 16 Mar. 1998 | Data Processing Method and Apparatus (Dot01) | 09/112,781 (Jul. 10, 1998) |
| PP2371 | 16 Mar. 1998 | Data Processing Method and Apparatus (Dot02) | 09/113,052 (Jul. 10, 1998) |

Artcam Technologies

Further, the present application may include the utilization of camera and data processing techniques such as an Artcam type device as described in the following Australian provisional patent specifications incorporated here by cross-reference. The serial numbers of respective corresponding US patent applications are also provided for the sake of convenience.

| Australian Provisional Number | Filing Date | Title | U.S. Pat. No./Patent application and Filing Date |
|---|---|---|---|
| PO7991 | 15 Jul. 1997 | Image Processing Method and Apparatus (ART01) | 09/113,060 (Jul. 10, 1998) |
| PO7988 | 15 Jul. 1997 | Image Processing Method and Apparatus (ART02) | 6,476,863 (Jul. 10, 1998) |
| PO7993 | 15 Jul. 1997 | Image Processing Method and Apparatus (ART03) | 09/113,073 (Jul. 10, 1998) |
| PO9395 | 23 Sep. 1997 | Data Processing Method and Apparatus (ART04) | 6,322,181 (Jul. 10, 1998) |
| PO8017 | 15 Jul. 1997 | Image Processing Method and Apparatus (ART06) | 09/112,747 (Jul. 10, 1998) |
| PO8014 | 15 Jul. 1997 | Media Device (ART07) | 6,227,648 (Jul. 10, 1998) |
| PO8025 | 15 Jul. 1997 | Image Processing Method and Apparatus (ART08) | 09/112,750 (Jul. 10, 1998) |
| PO8032 | 15 Jul. 1997 | Image Processing Method and Apparatus (ART09) | 09/112,746 (Jul. 10, 1998) |
| PO7999 | 15 Jul. 1997 | Image Processing Method and Apparatus (ART10) | 09/112,743 (Jul. 10, 1998) |
| PO7998 | 15 Jul. 1997 | Image Processing Method and Apparatus (ART11) | 09/112,742 (Jul. 10, 1998) |
| PO8031 | 15 Jul. 1997 | Image Processing Method and Apparatus (ART12) | 09/112,741 (Jul. 10, 1998) |
| PO8030 | 15 Jul. 1997 | Media Device (ART13) | 6,196,541 (Jul. 10, 1998) |
| PO7997 | 15 Jul. 1997 | Media Device (ART15) | 6,195,150 (Jul. 10, 1998) |
| PO7979 | 15 Jul. 1997 | Media Device (ART16) | 6,362,868 (Jul. 10, 1998) |
| PO8015 | 15 Jul. 1997 | Media Device (ART17) | 09/112,738 (Jul. 10, 1998) |
| PO7978 | 15 Jul. 1997 | Media Device (ART18) | 09/113,067 (Jul. 10, 1998) |
| PO7982 | 15 Jul 1997 | Data Processing Method and Apparatus (ART 19) | 6,431,669 (Jul. 10, 1998) |
| PO7989 | 15 Jul. 1997 | Data Processing Method and Apparatus (ART20) | 6,362,869 (Jul. 10, 1998) |
| PO8019 | 15 Jul. 1997 | Media Processing Method and Apparatus (ART21) | 6,472,052 (Jul. 10, 1998) |
| PO7980 | 15 Jul. 1997 | Image Processing Method and Apparatus (ART22) | 6,356,715 (Jul. 10, 1998) |
| PO8018 | 15 Jul. 1997 | Image Processing Method and Apparatus (ART24) | 09/112,777 (Jul. 10, 1998) |
| PO7938 | 15 Jul. 1997 | Image Processing Method and Apparatus (ART25) | 09/113,224 (Jul. 10, 1998) |
| PO8016 | 15 Jul. 1997 | Image Processing Method and Apparatus (ART26) | 6,366,693 (Jul. 10, 1998) |
| PO8024 | 15 Jul. 1997 | Image Processing Method and Apparatus (ART27) | 6,329,990 (Jul. 10, 1998) |
| PO7940 | 15 Jul. 1997 | Data Processing Method and Apparatus (ART28) | 09/113,072 (Jul. 10, 1998) |
| PO7939 | 15 Jul. 1997 | Data Processing Method and Apparatus (ART29) | 09/112,785 (Jul. 10, 1998) |
| PO8501 | 11 Aug. 1997 | Image Processing Method and Apparatus (ART30) | 6,137,500 (Jul. 10, 1998) |
| PO8500 | 11 Aug. 1997 | Image Processing Method and Apparatus (ART31) | 09/112,796 (Jul. 10, 1998) |
| PO7987 | 15 Jul. 1997 | Data Processing Method and Apparatus (ART32) | 09/113,071 (Jul. 10, 1998) |
| PO8022 | 15 Jul. 1997 | Image Processing Method and Apparatus (ART33) | 6,398,328 (Jul. 10, 1998) |
| PO8497 | 11 Aug. 1997 | Image Processing Method and Apparatus (ART34) | 09/113,090 (Jul. 10, 1998) |
| PO8020 | 15 Jul. 1997 | Data Processing Method and Apparatus (ART38) | 6,431,704 (Jul. 10, 1998) |
| PO8023 | 15 Jul. 1997 | Data Processing Method and Apparatus (ART39) | 09/113,222 (Jul. 10, 1998) |
| PO8504 | 11 Aug. 1997 | Image Processing Method and Apparatus (ART42) | 09/112,786 (Jul. 10, 1998) |
| PO8000 | 15 Jul. 1997 | Data Processing Method and Apparatus (ART43) | 6,415,054 (Jul. 10, 1998) |
| PO7977 | 15 Jul. 1997 | Data Processing Method and Apparatus (ART44) | 09/112,782 (Jul. 10, 1998) |

-continued

| Australian Provisional Number | Filing Date | Title | U.S. Pat. No./Patent application and Filing Date |
| --- | --- | --- | --- |
| PO7934 | 15 Jul. 1997 | Data Processing Method and Apparatus (ART45) | 09/113,056 (Jul. 10, 1998) |
| PO7990 | 15 Jul. 1997 | Data Processing Method and Apparatus (ART46) | 09/113,059 (Jul. 10, 1998) |
| PO8499 | 11 Aug. 1997 | Image Processing Method and Apparatus (ART47) | 6,486,886 (Jul. 10, 1998) |
| PO8502 | 11 Aug. 1997 | Image Processing Method and Apparatus (ART48) | 6,381,361 (Jul. 10, 1998) |
| PO7981 | 15 Jul. 1997 | Data Processing Method and Apparatus (ART50) | 6,317,192 (Jul. 10, 1998) |
| PO7986 | 15 Jul. 1997 | Data Processing Method and Apparatus (ART51) | 09/113,057 (Jul. 10, 1998) |
| PO7983 | 15 Jul. 1997 | Data Processing Method and Apparatus (ART52) | 09/113,054 (Jul. 10, 1998) |
| PO8026 | 15 Jul. 1997 | Image Processing Method and Apparatus (ART53) | 09/112,752 (Jul. 10, 1998) |
| PO8027 | 15 Jul. 1997 | Image Processing Method and Apparatus (ART54) | 09/112,759 (Jul. 10, 1998) |
| PO8028 | 15 Jul. 1997 | Image Processing Method and Apparatus (ART56) | 09/112,757 (Jul. 10, 1998) |
| PO9394 | 23 Sep. 1997 | Image Processing Method and Apparatus (ART57) | 6,357,135 (Jul. 10, 1998) |
| PO9396 | 23 Sep. 1997 | Data Processing Method and Apparatus (ART58) | 09/113,107 (Jul. 10, 1998) |
| PO9397 | 23 Sep. 1997 | Data Processing Method and Apparatus (ART59) | 6,271,931 (Jul. 10, 1998) |
| PO9398 | 23 Sep. 1997 | Data Processing Method and Apparatus (ART60) | 6,353,772 (Jul. 10, 1998) |
| PO9399 | 23 Sep. 1997 | Data Processing Method and Apparatus (ART61) | 6,106,147 (Jul. 10, 1998) |
| PO9400 | 23 Sep. 1997 | Data Processing Method and Apparatus (ART62) | 09/112,790 (Jul. 10, 1998) |
| PO9401 | 23 Sep. 1997 | Data Processing Method and Apparatus (ART63) | 6,304,291 (Jul. 10, 1998) |
| PO9402 | 23 Sep. 1997 | Data Processing Method and Apparatus (ART64) | 09/112,788 (Jul. 10, 1998) |
| PO9403 | 23 Sep. 1997 | Data Processing Method and Apparatus (ART65) | 6,305,770 (Jul. 10, 1998) |
| PO9405 | 23 Sep. 1997 | Data Processing Method and Apparatus (ART66) | 6,289,262 (Jul. 10, 1998) |
| PP0959 | 16 Dec. 1997 | A Data Processing Method and Apparatus (ART68) | 6,315,200 (Jul. 10, 1998) |
| PP1397 | 19 Jan. 1998 | A Media Device (ART69) | 6,217,165 (Jul. 10, 1998) |

The invention claimed is:

1. A method of processing a digital image comprising:
   capturing an image of a scene with a digital camera utilising an adjustable focusing technique of the digital camera to produce the digital image;
   detecting structures within the digital image by processing the digital image with a processor of the digital camera utilising focusing settings of the adjustable focusing technique as an indicator of positions of said structures; and
   applying image effects to the detected structures with said processor.

2. A method as claimed in claim 1 further comprising the step of:
   capturing said digital image utilising a zooming technique; and
   utilising zooming settings in a heuristic manner so as to process portions of said digital image.

3. A method as claimed in claim 1 wherein said processing comprises utilising auto focus information to assist in the location of objects within the image.

4. A method as claimed in claim 1 wherein said focusing settings are derived from a CCD captured digital image.

* * * * *